US006144319A

United States Patent [19]

Lutz et al.

[11] Patent Number: 6,144,319

[45] **Date of Patent: *Nov. 7, 2000**

[54] ANTI-SURVEILLANCE DEVICE FOR KEYBOARDS

[75] Inventors: Heinz Lutz, Weil i.Schoenbuch; Peter Schmidt, Gaertringen, both of Germany

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/676,734

[22] PCT Filed: Feb. 6, 1994

[86] PCT No.: PCT/EP95/00409

§ 371 Date: Apr. 10, 1998

§ 102(e) Date: Apr. 10, 1998

[87] PCT Pub. No.: WO95/23421

PCT Pub. Date: Aug. 31, 1995

[30] Foreign Application Priority Data

Feb. 25, 1994 [DE] Germany ............................ 44 06 115

[51] Int. Cl.$^{7}$ ................................................ H03K 17/94

[52] U.S. Cl. ............................... 341/22; 341/20; 379/447

[58] Field of Search ................................ 341/20, 22, 34; 359/601; 379/25 D, 447, 450, 451; 902/2 D; 109/2, 10, 49.5; D14/114, 250; 340/825.31; 312/208.3

[56] References Cited

U.S. PATENT DOCUMENTS

| | | | |
|---|---|---|---|
| D. 342,944 | 1/1994 | Rhodes | D14/114 |
| D. 359,288 | 6/1995 | Underwood | D14/250 |
| 3,893,073 | 7/1975 | Angello | 340/147 MD |
| 4,032,931 | 6/1977 | Haker | 902/20 X |
| 4,479,112 | 10/1984 | Hirsch | 109/2 X |
| 4,632,511 | 12/1986 | Louw | 359/601 |
| 4,644,326 | 2/1987 | Villalobos et al. | 341/34 |
| 5,274,370 | 12/1993 | Morgan et al. | 340/825.31 X |
| 5,353,349 | 10/1994 | Brown | 379/450 |
| 5,385,417 | 1/1995 | Wade et al. | 400/472 |
| 5,419,704 | 5/1995 | North | 312/208.3 X |
| 5,564,486 | 10/1996 | Deigman | 160/113 |
| 5,748,728 | 5/1998 | Ginsberg et al. | 379/447 |

FOREIGN PATENT DOCUMENTS

| | | | |
|---|---|---|---|
| 0 382 622 | 8/1990 | European Pat. Off. . | |
| 31 10863 | 9/1982 | Germany . | |
| 84/04982 | 12/1984 | WIPO | 341/34 |

OTHER PUBLICATIONS

Research Disclosure, Jul. 1986, No. 26,712, "Resistive Film Touch Panel".

Research Disclosure, No. 30859, Dec. 1989, p. 947, XP 000096116, "Pin Keyboard with Non–Obsuring Security Feature".

*Primary Examiner*—Michael Horabik
*Assistant Examiner*—Timothy Edwards, Jr.
*Attorney, Agent, or Firm*—Daniel E. McConnell; Anthony N. Magistrale

[57] ABSTRACT

An anti-surveillance device for keyboards, particularly for the keyboards of cash dispensing machines or electronic cash devices, in order to prevent unwanted viewing of the keyboard from the side. The invention comprises at least one anti-surveillance filter (3), preferably exhibiting a lamellar or lamellar-grid structure, where only the lamellae consist of opaque material and where the anti-surveillance filter (3) is disposed above the keyboard (5).

12 Claims, 6 Drawing Sheets

ANTI-SURVEILLANCE DEVICE FOR KEYBOARDS

Figure 1:
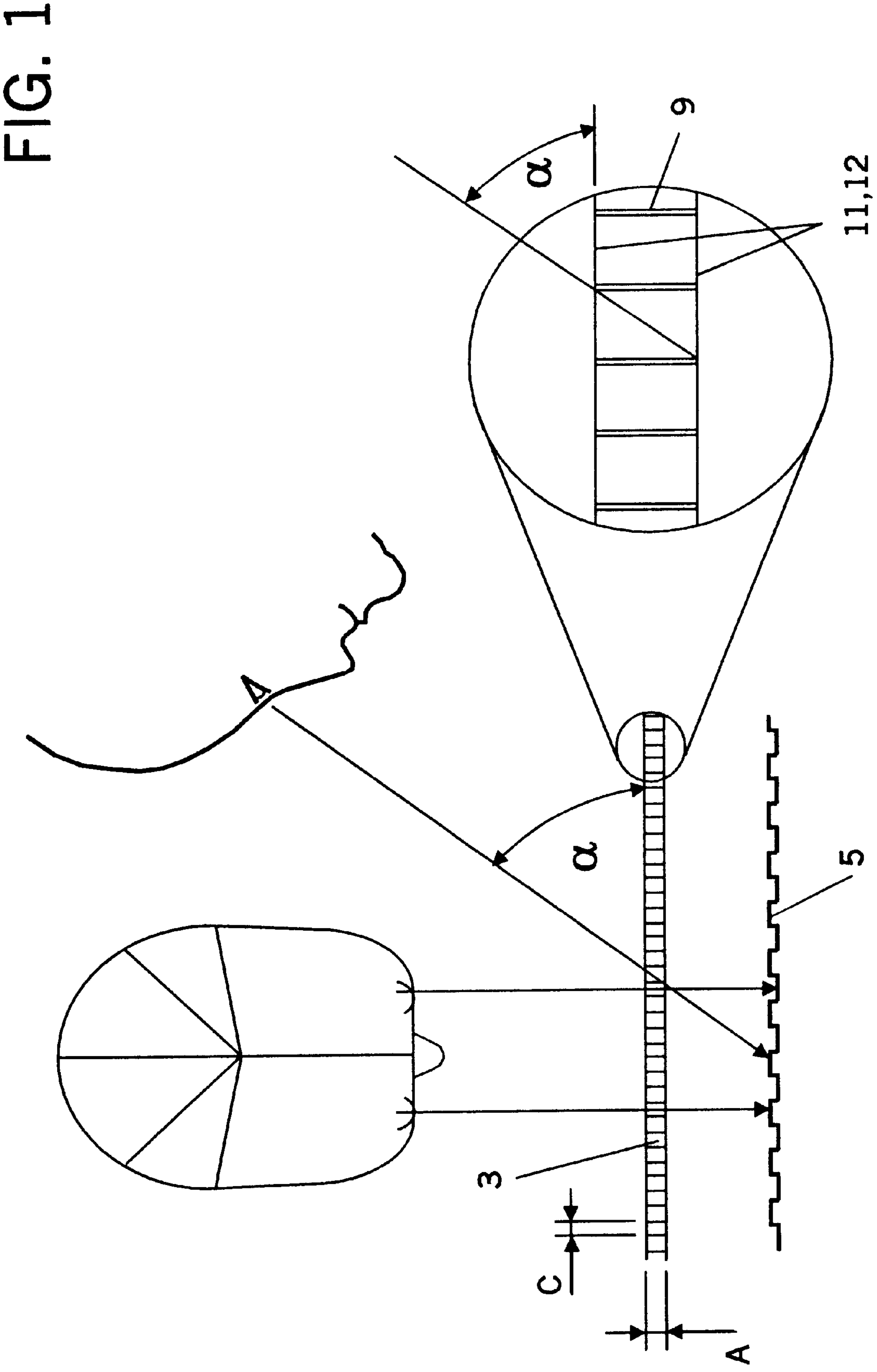

The present invention describes an anti-surveillance device for keyboards, particularly for the keyboards of cash dispensing machines or electronic cash devices, in order to prevent unwanted viewing of the keyboard.

Cash dispensers are generally installed in public locations which are accessible to anybody. There is therefore a justifiable security requirement to protect the keyboard of cash dispensers from being viewed by third parties or to arrange the keyboard spatially in such a way that the entry of secret codes cannot be observed by persons standing in the vicinity. On the other hand, the keyboard must, while taking this factor into consideration, also be user-friendly.

The cash dispensers available on the market take insufficient account of this security aspect. Thus, there are in use cash dispensers which take no security precautions whatsoever against unwanted surveillance of the keyboard. Here it is left to the user himself to decide how he enters his confidential code without third parties being able to view the entry of his confidential code. Other cash dispensers are integrated structurally into a building in such a manner that viewing of the keyboard from the side is substantially prevented by the existence of projecting side walls preventing viewing. This type of anti-surveillance is relatively expensive, since structural alterations to the building are often required. In general, this type of anti-surveillance is not user-friendly.

Other types of cash dispensers employ keyboards which are set deeper into the operating surface. This only partially solves the problem of anti-surveillance. In addition, wheelchair users and persons of smaller stature have problems with the deep-set keyboards.

The above disadvantages also apply essentially to the keyboards of electronic cash equipment. These keyboards, however, unlike the keyboards of cash dispensers, are not in a fixed place. They are handed over to the customer at the sales counter without adequate security against surveillance. There is normally considerable customer traffic at the sales counter. It is scarcely possible to prevent undesired surveillance by third parties.

U.S. Pat. No. 3,893,073 discloses a screen which contains a security film to prevent undesired surveillance by third parties which reduces the viewing angle to the user region.

Research disclosure No. 26,712, July 1986, discloses a touch-sensitive screen with a security film to protect the screen from interfering environmental influences.

It is the object of the present invention to provide a security device for keyboards which offers a maximum amount of protection against surveillance, particularly against surveillance from the side, whilst maintaining user-friendliness, which is simple to construct and economical to manufacture and which can be fitted subsequently to almost all types of keyboard without structural modifications.

This is effected by the features set out in the characterising part of the main claim.

Further advantageous embodiments of the security device in accordance with the invention are defined in the sub-claims.

The advantages achieved by the invention lie mainly in that keyboards of a wide variety of types can be fitted retrospectively with the anti-surveillance device in accordance with the invention, without structural modifications. A further advantage of the anti-surveillance device in accordance with the invention resides in the fact that the viewing area of the keyboard can be readily matched to the requirements of the user and the local conditions. A further advantage of the anti-surveillance device in accordance with the invention lies in its constructionally simple structure and the cheapness of its manufacture.

Figure 2A:
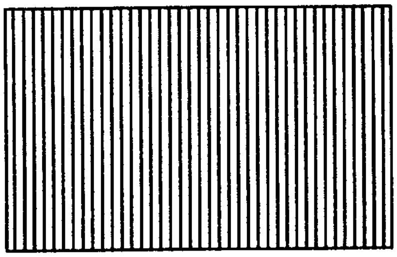
Figure 2B:
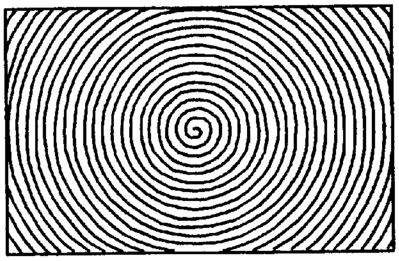
Figure 2C:
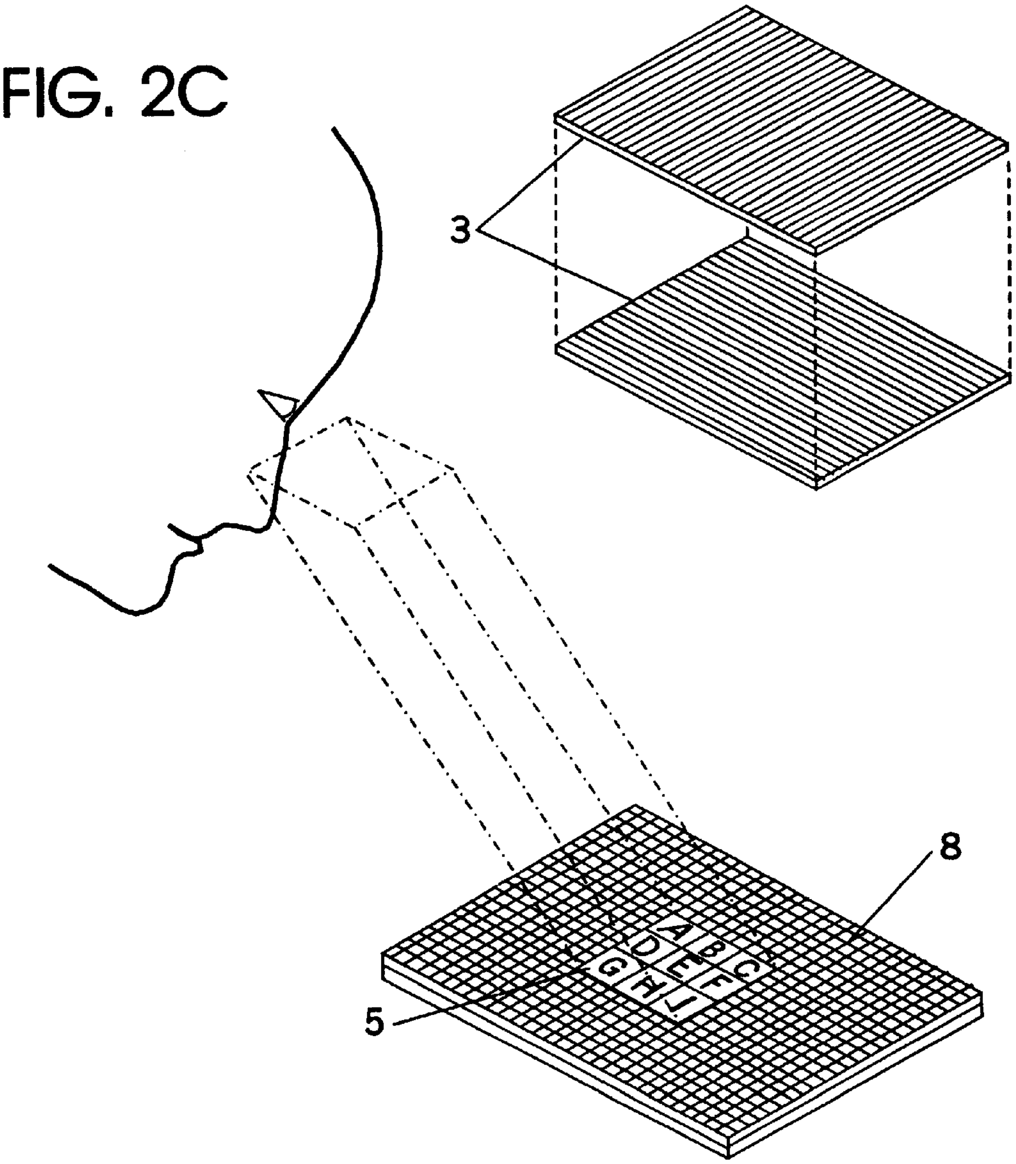
Figure 3:
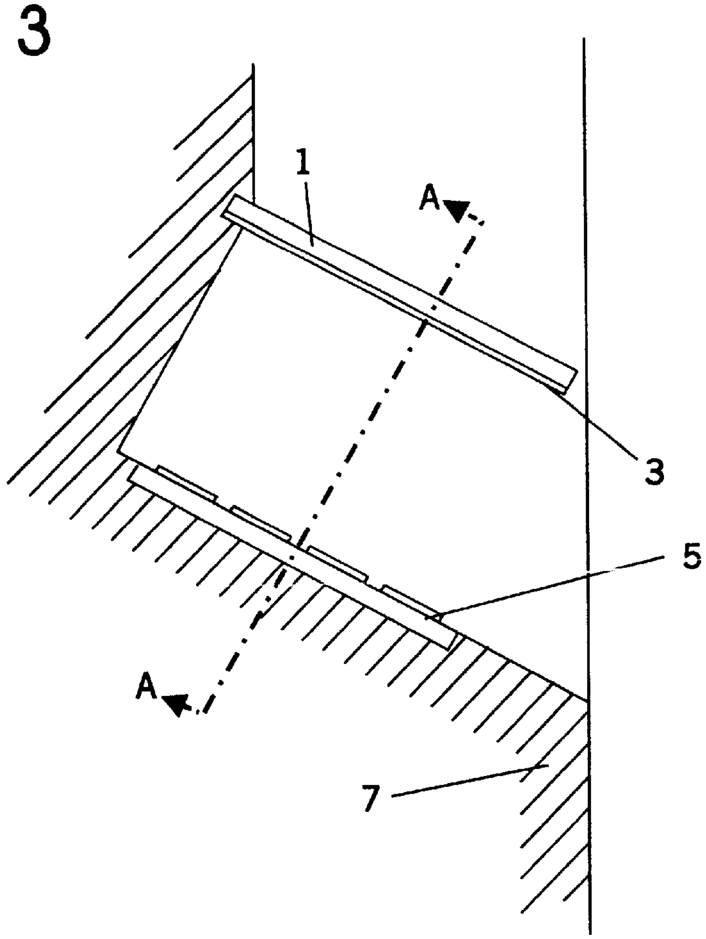
Figure 4:
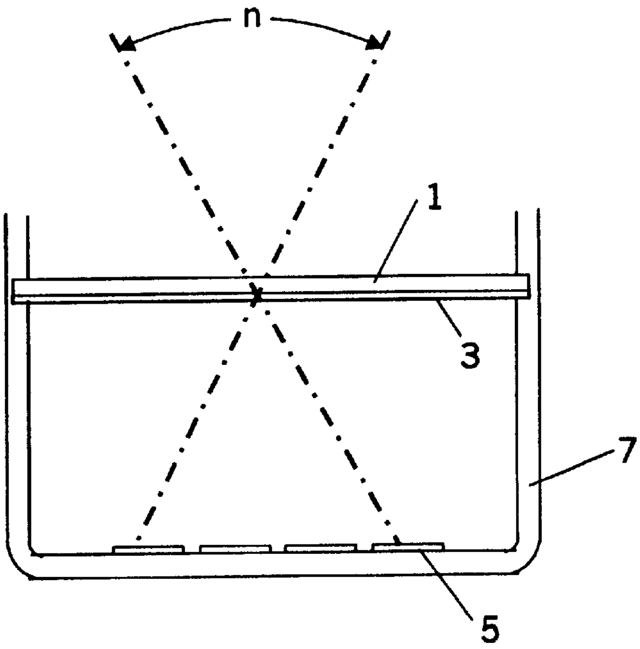
Figure 5:
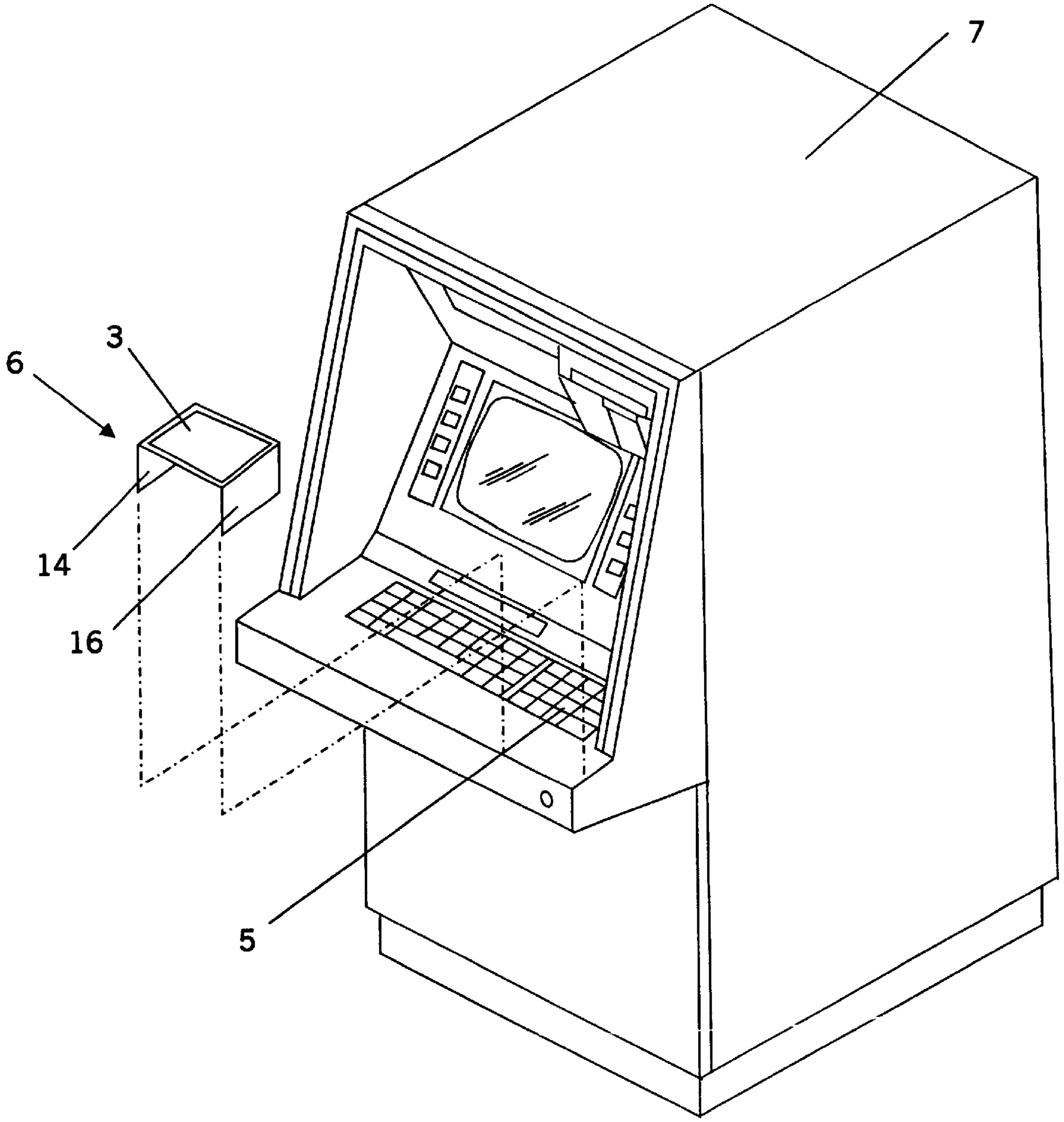
Figure 6:
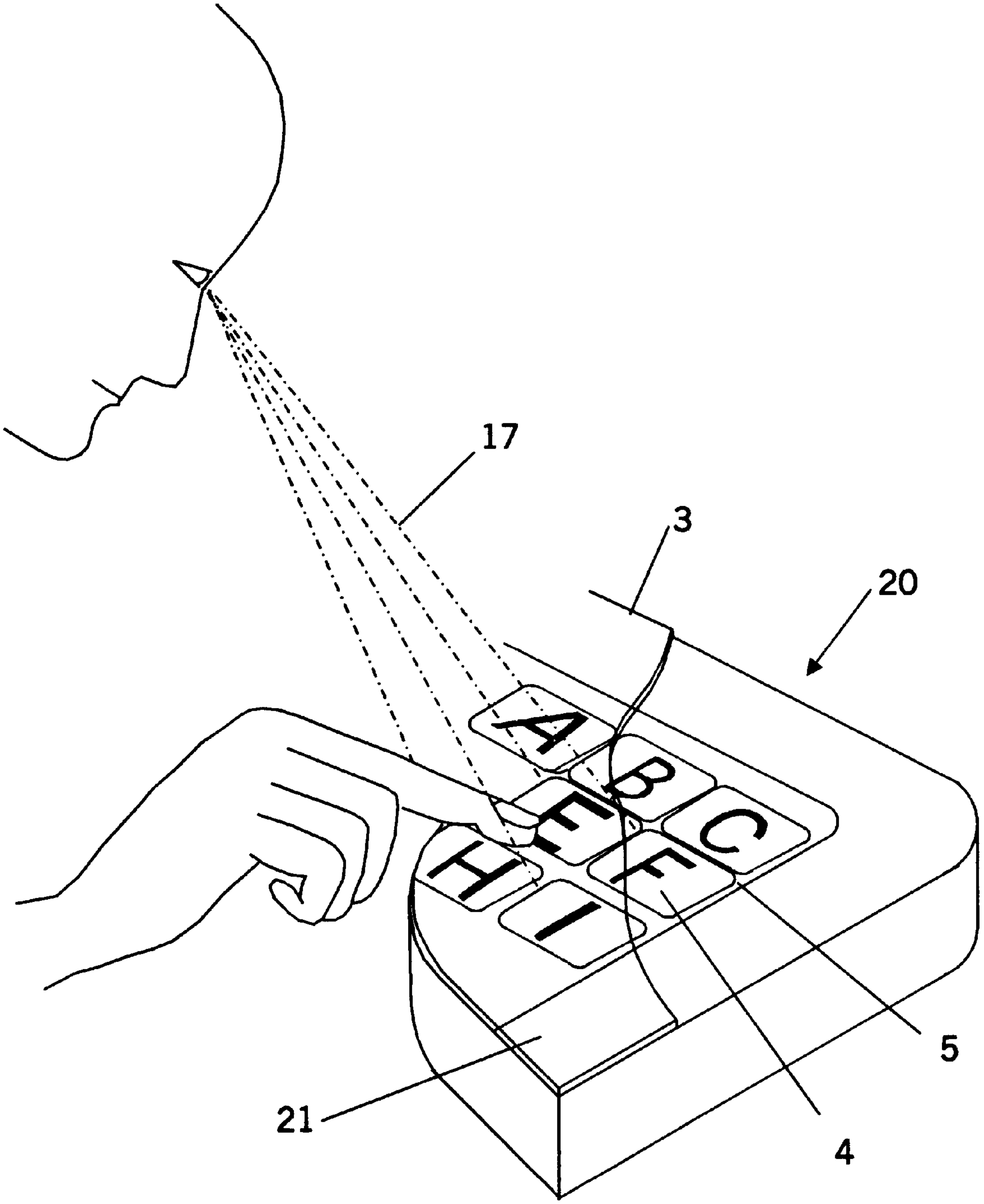
Figure 7:
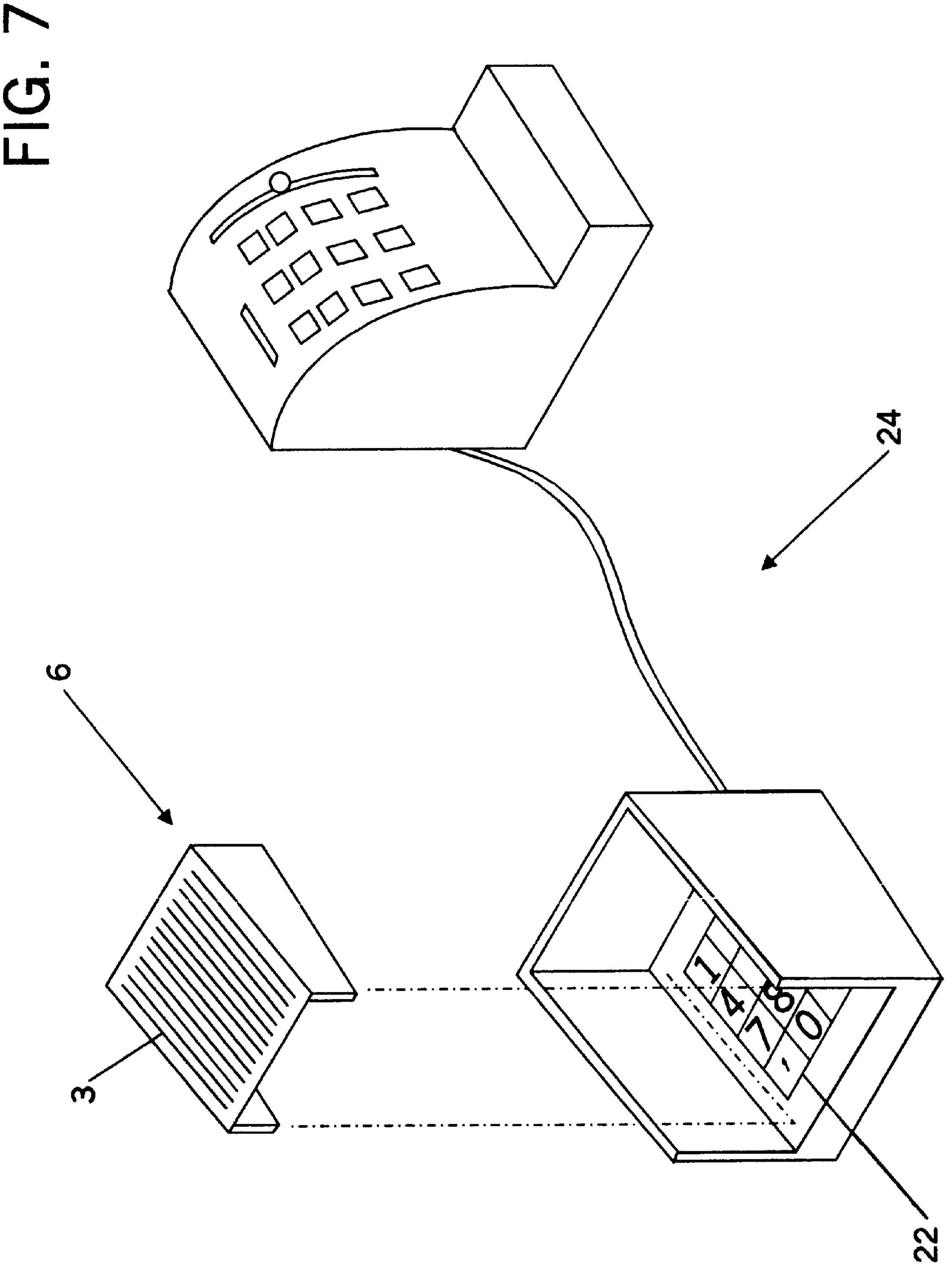

The invention is explained below in more detail by means of several preferred examples and representative drawings, where:

FIG. 1 shows the main structural features of an anti-surveillance filter, as used preferentially in the anti-surveillance device in accordance with the invention, FIG. 2 shows examples of an anti-surveillance filter using details A, B and C as used in the anti-surveillance device in accordance with the invention, FIG. 3 a sectional view through a keyboard arrangement of a cash dispensing machine with a preferred form of embodiment of the anti-surveillance device in accordance with the invention, FIG. 4 a section A—A through the keyboard arrangement in accordance with FIG. 1, FIG. 5 a cash dispenser with a further embodiment of the anti-surveillance device in accordance with the invention, FIG. 6 the implementation of the anti-surveillance device in accordance with the invention in a membrane keyboard and FIG. 7 an electronic cash system with a preferred embodiment of the anti-surveillance device in accordance with the invention.

FIG. 1 shows the main construction of the anti-surveillance filter 3 as used preferentially in the anti-surveillance device in accordance with the invention. The anti-surveillance filter 3 has a parallel lamellar structure and consists of a transparent layer 11, 12 and an opaque layer 9. The angle of viewing a is dependent on the two dimensions D and C. D stands for the thickness of the anti-surveillance filter 3 and C stands for the separation of the lamellae 9. The keyboard can only be viewed from an angle of 90-α.

FIG. 2 shows several examples of anti-surveillance filters as employed in the anti-surveillance device in accordance with the invention.

Detail A shows an anti-surveillance filter 3 with the possible parallel lamellar arrangement. The arrangement of the lamellae effects a cutoff of the viewing angle from the side.

Detail B shows a spiral lamellae arrangement with an all-round cutoff effect. The same all-round cutoff effect can be achieved with a circular arrangement of the lamellae. Only the user of the keyboard is in the position to recognise the corresponding keys under the anti-surveillance filter.

Detail C shows a further example of an anti-surveillance filter 8 consisting of two individual anti-surveillance filters 3, which are arranged at an angle of 90° to one another, so that the lamellae of the individual anti-surveillance filters 3 are arranged at right angles (in the form of a grid) to one another. In this way an all-round anti-surveillance cutoff action is achieved. A rectangular viewing zone is produced on the keyboard 5. This form of embodiment of the anti-surveillance filter 8 is particularly suitable for those keyboards where all-round security against lateral viewing is required, such as, for example, keyboards of electronic cash systems. A further embodiment of the anti-surveillance filter consists in that the anti-surveillance filter itself has a structure of lamellae arranged at right angles to one another and this likewise provides an all-round security against lateral surveillance.

As shown in FIG. 3, a preferred embodiment of the anti-surveillance device in accordance with the invention consists of an anti-surveillance filter 3 and a transparent glass or plastics panel 1. The anti-surveillance filter 3 is preferably bonded to the glass or plastic panel 1. The anti-surveillance device is thus arranged at a fixed distance from the input region of the keyboard 5 at an angle. The distance between keyboard input region and the anti-surveillance device is to be determined in such a way that the user can conveniently operate the keyboard 5. The anti-surveillance device 3 displays a parallel lamellae or grid shape lamellar structure, which produces a anti-surveillance cutoff action against lateral surveillance. Only from the user position can the keyboard input region be seen.

FIG. 4 shows a section A—A through FIG. 3. The lamellar arrangement of the anti-surveillance filter 3 is disposed in such a way that viewing of the keyboard 5 is only possible at an angle of n to the anti-surveillance filter 3. The anti-surveillance device is only open on the user's side. The remaining region between the keyboard input region and the anti-surveillance device is closed by a cash dispensing machine 7.

FIG. 5 shows a further embodiment of the anti-surveillance device in accordance with the invention for a cash dispenser 7. The anti-surveillance device consists of a preferably U-shaped part 6, the transverse section of which is formed as an anti-surveillance filter 3. A further embodiment consists in that the anti-surveillance device consists of a U-shaped section 6 and a separate light-protecting filter 3, which is bonded between the vertical plates 14, 16 of the U-shaped part on the user's side. The side parts 14, 16 consist of opaque material, in order to prevent the keyboard 5 from being viewed from the side.

The length of the vertical plates 14, 16 defines the distance separating the keyboard input region and the anti-surveillance filter 3. The plates 14, 16 are preferably bonded to the keyboard.

FIG. 6 shows a membrane keyboard 20 with a further embodiment of the anti-surveillance device in accordance with the invention. The anti-surveillance filter 3 is either only applied in the region of the keys 4 or over the whole keyboard 5. The anti-surveillance filter 3 is preferably protected by a covering film 21.

A further embodiment of the membrane keyboard consists of individual keys which contain an LCD display, where the keys are not covered with a fixed number , but are continuously covered with new numbers by a special software program. This form of keyboard in combination with the anti-surveillance device in accordance with the invention for membrane keyboards ensures an almost 100% protection against lateral viewing.

FIG. 7 shows a further embodiment of the anti-surveillance device in accordance with the invention 6 for keyboards 22 of electronic cash systems. This embodiment generally corresponds to the embodiment of the anti-surveillance device in accordance with the invention described in detail under FIG. 3. In the case where the keyboard 22 is not protected against overviewing from behind on the user's side, the anti-surveillance device is formed as a U-shape as in FIG. 3, but with the addition that the U-shaped anti-surveillance device is closed on the side employed by the user.

What is claimed is:

1. An anti-surveillance keyboard comprising:

a keyboard defining an entry region, and an anti-surveillance filter mounted at a fixed distance above the entry region of the keyboard, the fixed distance being such that operation of the keyboard is possible and viewing of the keyboard from a position beside the keyboard is precluded, wherein said fixed distance is at least sufficient for a user to operate said keyboard using a space between said filter and said keyboard.

2. An anti-surveillance keyboard in accordance with claim 1 and further wherein said filter is bonded to a transparent material, the transparent material being selected from the group consisting of glass and plastic.

3. An anti-surveillance keyboard in accordance with claim 1 wherein said filter has a parallel lamellar structure and only the lamellae consist of opaque material.

4. An anti-surveillance keyboard in accordance with claim 1 wherein said filter has a lamellar-grid structure with lamallae arranged at right-angles to one another and only the lamellae consist of opaque material.

5. An anti-surveillance keyboard in accordance with claim 1 wherein said filter comprises two individual anti-surveillance filters with a parallel lamellar structure, the individual anti-surveillance filters being arranged on one another in such a way that the lamellae of the individual anti-surveillance filters are at right-angles to one another, and further where only the lamellae consist of opaque material.

6. An anti-surveillance keyboard in accordance with claim 1 wherein said filter has a lamellar structure defining arcs about a center and further wherein only the laminae are formed of opaque material.

7. An anti-surveillance keyboard in accordance with claim 1 further comprising first and second side components and further wherein said anti-surveillance filter is arranged between said side components as a transverse component, said side components and said filter together forming a U-shape, and wherein said anti-surveillance keyboard is only accessible from a side facing the user.

8. An anti-surveillance keyboard in accordance with claim 7 and further wherein said filter is bonded to a transparent material, the transparent material being selected from the group consisting of glass and plastic.

9. An anti-surveillance keyboard in accordance with claim 7 wherein said filter has a parallel lamellar structure and only the lamellae consist of opaque material.

10. An anti-surveillance keyboard in accordance with claim 7 wherein said filter has a lamellar-grid structure with lamallae arranged at right-angles to one another and only the lamellae consist of opaque material.

11. An anti-surveillance keyboard in accordance with claim 7 wherein said filter comprises two individual anti-surveillance filters with a parallel lamellar structure, the individual anti-surveillance filters being arranged on one another in such a way that the lamellae of the individual anti-surveillance filters are at right-angles to one another, and further where only the lamellae consist of opaque material.

12. An anti-surveillance keyboard in accordance with claim 7 wherein said filter has a lamellar structure defining arcs about a center and further wherein only the laminae are formed of opaque material.

* * * * *